(12) United States Patent
Oberschmidt et al.

(10) Patent No.: US 6,735,261 B1
(45) Date of Patent: May 11, 2004

(54) CALIBRATION OF A N-PORT RECEIVER

(75) Inventors: Gerald Oberschmidt, Bruschal (DE);
Veselin Brankovic, Esslingen (DE);
Dragan Krupzevic, Stuttgart (DE);
Masayoshi Abe, Kanagawa (JP); Tino Konschak, Stuttgart (DE); Thomas Dölle, Stuttgart (DE)

(73) Assignees: Sony International (Europe) GmbH, Berlin (DE); Sony Corporation, Tokyo (JP)

( * ) Notice: Subject to any disclaimer, the term of this patent is extended or adjusted under 35 U.S.C. 154(b) by 600 days.

(21) Appl. No.: 09/611,488

(22) Filed: Jul. 7, 2000

(30) Foreign Application Priority Data

Jul. 8, 1999 (EP) .............................. 99113262

(51) Int. Cl.[7] ............................ H04L 27/06; H03C 3/00
(52) U.S. Cl. ........................ 375/316; 375/344; 375/224
(58) Field of Search ................................ 375/316, 224, 375/226, 345, 371, 373; 332/103

(56) References Cited

U.S. PATENT DOCUMENTS

| | | | | |
|---|---|---|---|---|
| 4,138,645 A | * | 2/1979 | Parato ..................... | 455/226.1 |
| 5,841,814 A | * | 11/1998 | Cupo ....................... | 375/321 |
| 5,973,643 A | * | 10/1999 | Hawkes et al. ........... | 342/457 |
| 6,052,419 A | * | 4/2000 | Hioki ....................... | 375/344 |

FOREIGN PATENT DOCUMENTS

| | | |
|---|---|---|
| EP | 0 805 561 | 11/1997 |
| EP | 0 884 836 | 12/1998 |
| EP | 0 896 455 | 2/1999 |
| WO | WO 99 08393 | 2/1999 |

OTHER PUBLICATIONS

Ji Li et al: "A New Direct Digital Receiver Performing Coherent PSK Reception" IEEE MTT–S International Microwave Symposium Digest, Orlando, May 16–20, 1995, vol. 3, May 16, 1995, pp. 1007–1010, XP000552909.

* cited by examiner

Primary Examiner—Tesfaldet Bocure
Assistant Examiner—Qutub Ghulamali
(74) Attorney, Agent, or Firm—Frommer Lawrence & Haug LLP; William S. Frommer; Darren M. Simon

(57) ABSTRACT

A technique for calibrating a N-port receiver, such as for example a 5- or 6-port receiver is proposed. The N-port receiver (1) comprises a first input (2) for a RF signal to be detected, a second input (3) for a RF signal originating from a local oscillator (4) and N−2 output terminals. Calibrating signals are generated on the basis of the RF signal supplied by the local oscillator (4). The calibration signals are fed to the first input (2) and/or the second input (3) of the N-port receiver (1). Calibration coefficients are calculated on the basis of the output signals generated by the N-port receiver (1) in response to the feeding of the calibration signals. The calibration signals are unmodulated signals and are only processed by means of a passive RF circuitry in the calibration device (100).

The solutions according to the present invention allow a simple calibration of N-port receivers, which can be used as IQ demodulators or converters. Thereby a local oscillator (4) is used as a RF source for the calibration.

22 Claims, 17 Drawing Sheets

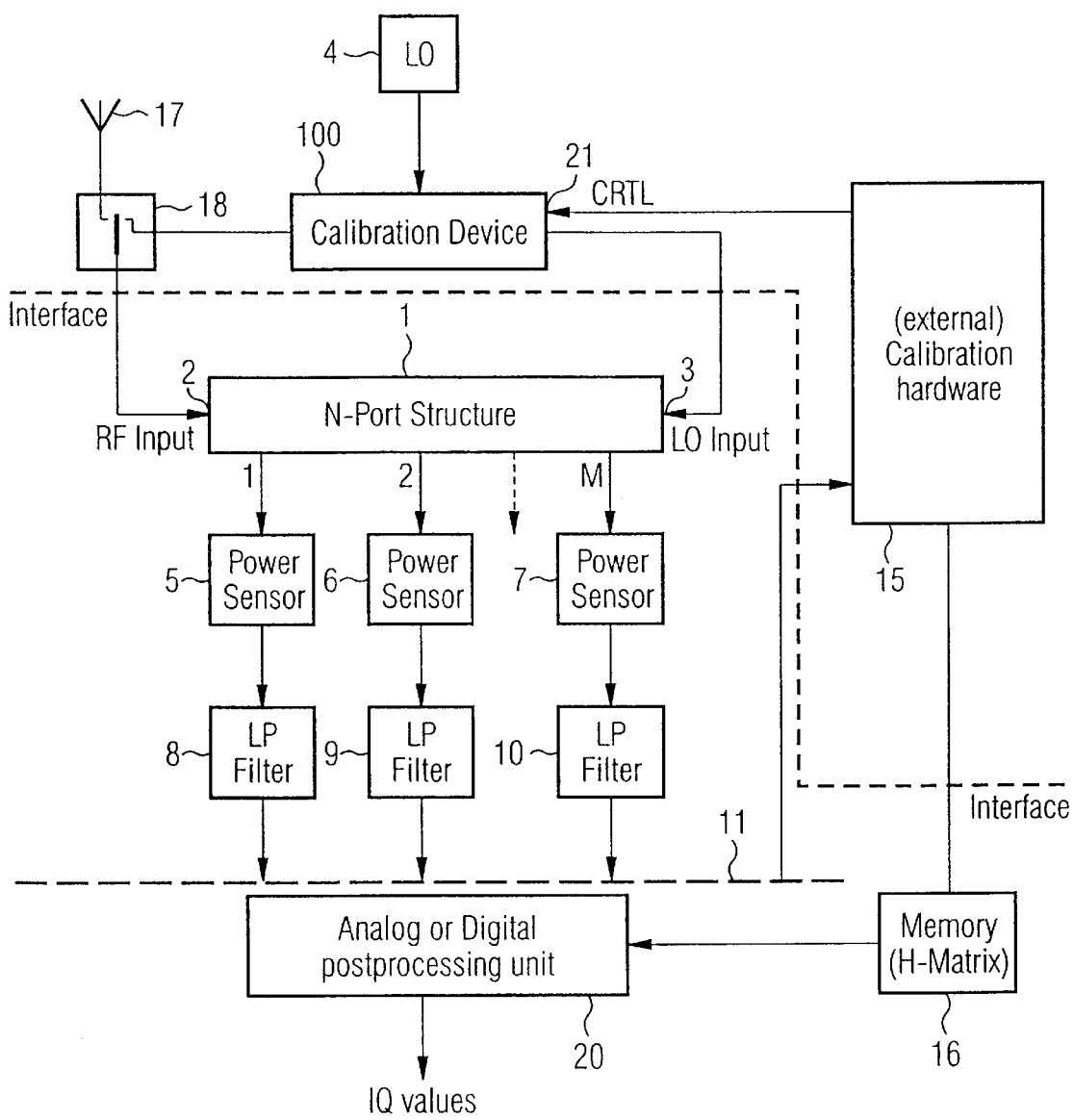

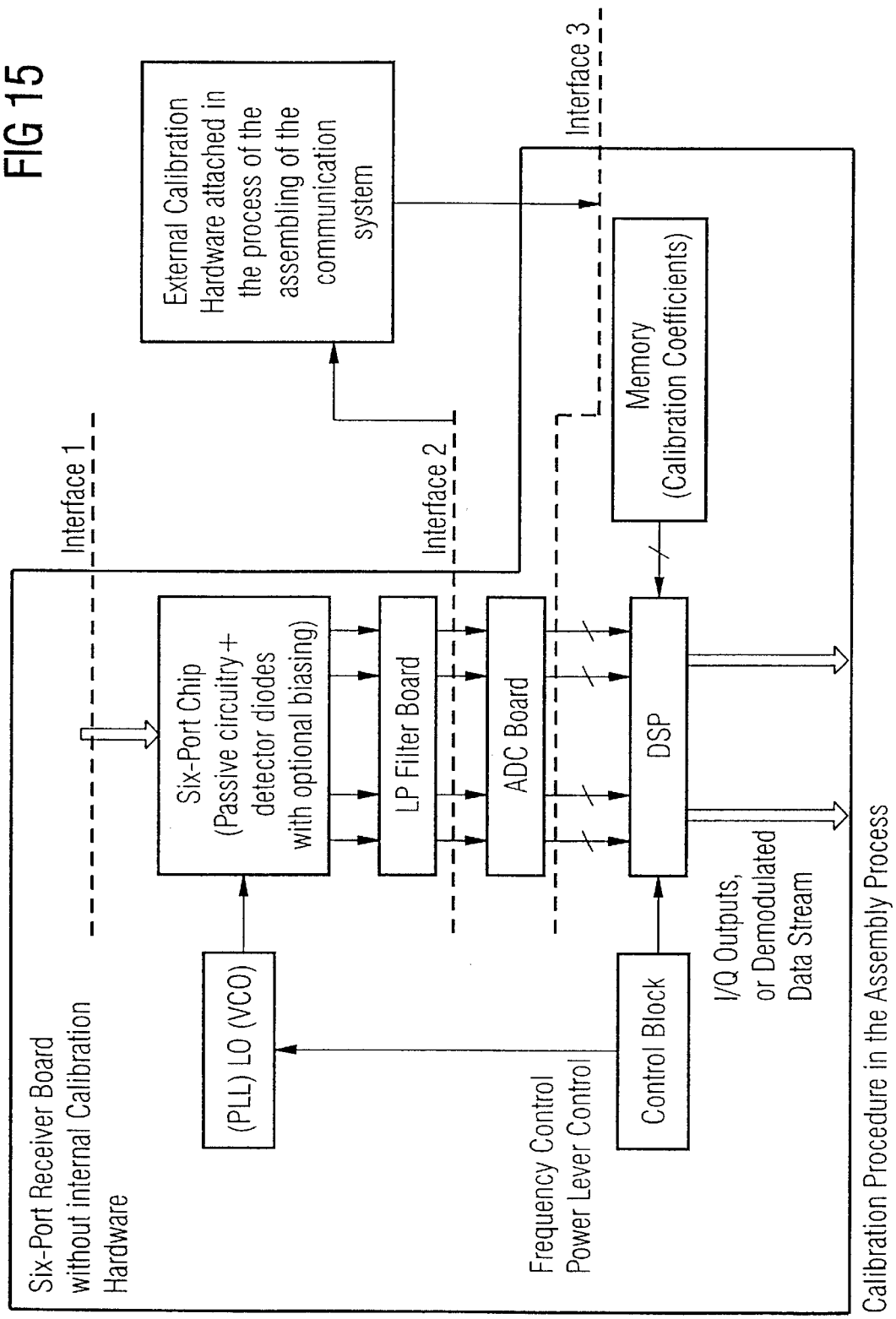

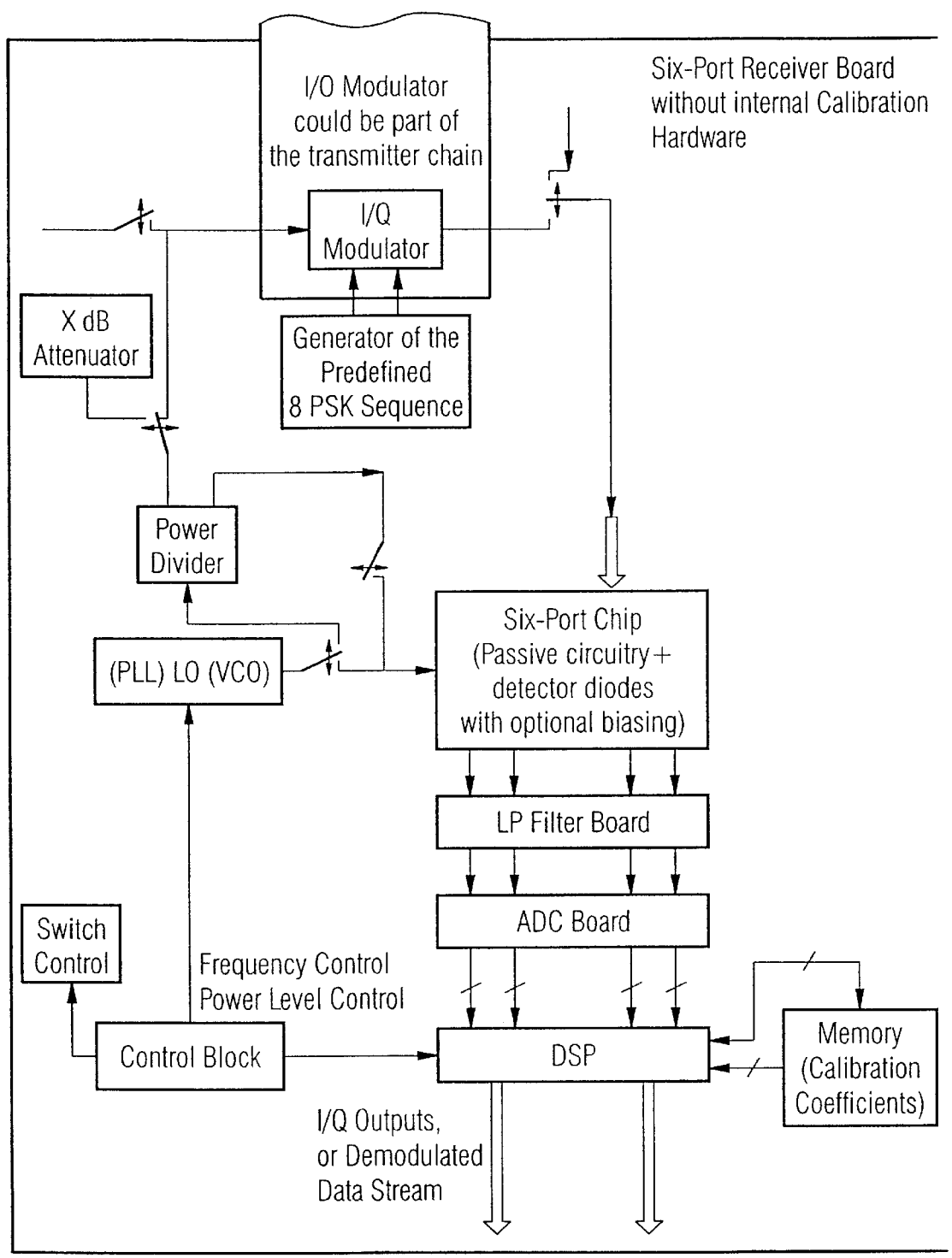
FIG 16 — PRIOR ART

CALIBRATION OF A N-PORT RECEIVER

FIELD OF THE INVENTION

The present invention relates generally to the technical field of N-port junction based RF receivers and particularly to a method and a device for calibrating a N-port receiver.

BACKGROUND OF THE INVENTION

When referencing to N-port receivers in the following description, N is an integer which is larger than two. As the case of N equal to six is known in the prior art, the following description is made with reference to a six-port receiver.

Recently is has been shown that a so-called six-port receiving circuit in conjunction with a digital signal processor is capable of performing digital demodulation directly at frequencies ranging from microwave to mm-wave bands. This new direct digital receiver promises reduced receiver complexity, low fabrication requirements and fair performance in providing a cost-effective alternative to the conventional heterodyne structure used in various digital terminals.

FIGS. 17A and 17B shows schematically the application area of a direct six-port receiver as a partial or complete replacement of a conventional heterodyne receiver.

FIG. 18 shows the structure of a six-port receiver known from Bossisio, Wu "A six-port direct digital millimetre wave receiver", Digest of 1994 IEEE MTT Symposium, vol. 3, page 1659–1662, San Diego, May 1994.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels of at least three of the six ports. The imperfections of the hardware can be readily eliminated by an appropriate calibration procedure. Very accurate measurements can be made in a wide dynamic and frequency range. Six-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies. The traditional IQ block in a receiver is replaced by a six-port phase/frequency discriminator which contains a six-port receiver and a digital signal processing (DSP) unit. The incoming digitally modulated RF-signal is compared with the output of a digital controlled local oscillator 218.

Six-port receivers generally allow for a calibration. One major advantage of the six-port receiver is the ability to cope with non-perfect (non-ideal) RF sub-systems. Calibration procedures extract the imperfections of the six-port hardware. The results of the calibration are in general real coefficients. These coefficients multiplied with the measured power levels at different ports are required to calculate the (relative) amplitude and (relative) phase of the incoming signal of the receiver. The relative magnitude and the relative phase are related to the coherent or non-coherent detection of the signal.

The calibration parameters are in general non-time dependent or very slowly changeable with time. Theoretically, the calculation of the correction calibration parameters needs to be performed only once. However, in practice they should be performed every time a very large time period has elapsed, which length should be evaluated on case by case basis. The change of the RF parameters depends on the environmental conditions as well as the manufacturing imperfections.

From the state of the art different calibration techniques for a six-port receiver structure have been proposed. They are generally applied for six-port structures for net work measurement issues and such as usage of hardware termination for calibration like known loads, shorts and sliding shorts.

There is a plurality of requirements for a calibration procedure for a direct receiver based on a six-port structure:

The calibration should be effected without physical disconnection of the system using the same programmed sampling rate as for the data transmission, the time for calibration should be as short as possible and the required computational effort for calibration coefficients should be minimized and adapted to fast hardware digital computation units.

Such calibration techniques are known from G F Engen, "Calibrating the six-port reflectometer by means of sliding termination", IEEE Trans. Microwave Theory Technique, vol. 26., pages 987–993, December 1978 and U. Stumper, "Finding initial estimates needed for the Engen method of calibrating single six-port reflectometers", IEEE Trans. Microwave Theory Technique, vol. 38, pages 951–957, July 1990.

Recently a calibration procedure for a six-port coherent direct receiver without physical disconnection of the system has been disclosed in J. Li, R. G. Bosisio and K. Wu "Dual-tone calibration of six-port direct digital millimetric receiver", IEEE Trans. Microwave Theory Technique, vol. 44, pages 93–99, January 1996.However, this known technique requires complicated monitoring of the outputs, large observation time and the alternation (change) of the local oscillator (see reference 18 in FIG. 4) level. In this document it is disclosed two use simply two different frequencies without any modulation and to supply them to the input ports of a six-port receiver.

According to WO 98/02856 a method for calibrating a N-port receiver is proposed, said N-port receiver comprising a passive circuit with two inputs, at least one input being supplied with a high-frequency signal to be measured, and at least three outputs supplying power levels for a signal processing unit, which signal processing unit calculates a complex signal based on the at least two power levels and calibration coefficients. A predetermined calibration sequence with different symbols is fed to at least one input for the signal to be measured and the calibration coefficients are calculated based on the calibration sequence.

FIG. 15 shows an embodiment for the calibration according to WO 98/02856, wherein the calibration procedure is effected during the manufacturing (assembly) process. Thereby an external calibration hardware is provided comprising interfaces. The interface is connected to an input of a six-port chip. The interface obtains filtered output signals of the six-port chip. The interface is connected to the memory storing calibration coefficients. The calibration by means of the external calibration hardware block can be performed during an automatic assembling process. The external calibration hardware is attached to the defined interfaces of the assembly containing the six-port receiver. The external calibration hardware sends a signal to one of the six-port inputs, takes the signal outputs at the related ports (interface), digitally converts the values, calculates the calibration coefficients by means of an external DSP and feeds the calculated calibration coefficients directly to the memory of the six-port receiver.

The calibration principle of attaching an external calibration device as shown for example in FIG. 15 is called off-line calibration in the present specification.

FIG. 16 shows another embodiment of the calibration according to WO 98/02856, wherein a hardware calibration block is placed as an additional chip on the same board as the N-port receiver. In that case, the six-port receiver is only a chip set as shown in FIG. 16. The complexity of the additional components is smaller than in the case of FIG. 15, as some of the clocks can be realized by using the transmitted chain. The integration of the calibration block within the board of the six-port receiver requires: an additional power divider and a X dB attenuator (or a power divider with programmable dividing ratio or, alternatively, a three-port power divider with at least two ports of different power outputs), a baseband block for the generation of the known 8 PSK signal, several switches and additional controlling requirements. The calibration can be done in the sleeptime (non-active time) of the receiver. Due to the additional blocks the embodiment according to FIG. 16 is more expensive in comparison to the approach according to FIG. 15, but offers the possibility of a calibration of the receiver in the case of environmental changes.

The calibration principle of using an internal (on-chip) calibration device as shown f.e. in FIG. 16 is called on-line calibration in the present specification.

As can be seen from FIG. 16, according to said prior art it is necessary to provide a dedicated baseband block for the generation of the known 8PSK signal.

SUMMARY OF THE INVENTION

In view of said prior art it is the object of the present invention to simplify the complexity of the calibration technique.

Said object is achieved by means of the features of the independent claims. The dependent claims developed further the central idea of the present invention.

According to the present invention therefore the method for calibrating a N-port receiver is provided. The N-port receiver comprises a first input for a RF signal to be detected, a second input for a RF signal originating from a local oscillator and N−2 output terminals. N is an integer larger than two. Calibration signals are generated on the basis of the RF signal supplied by the local oscillator. The calibration signals are fed to the first input and/or second input of the N-port receiver. Calibration coefficients are calculated on the basis of the output signal generated by the N-port receiver in response to the feeding of the calibration signals. The calibration signals thereby are unmodulated signals. The provision of a modulator in the baseband block for the calibration signals therefore is no longer necessary. This alone already simplifies the structure of the calibration technique.

The step of generating the calibration signals can comprise the steps of dividing (splitting) the RF signals supplied by the local oscillator into a first and a second branch and processing at least one of the first and second branch.

The step of processing at least one of the first and second branch can comprise the step of generating a plurality of RF signals relatively phase shifted to each other, and supplying sequentially the RF signals relatively phase shifted to each other to the first input and/or the second input of the N-port receiver.

The step of calculating calibration coefficients can comprise the step of sampling time sequentially a plurality of output signals generated by the N-port receiver in response to the feeding of the calibration signal, wherein the calibration signal assumes different phase states, and calculating the elements of a calibration matrix as calibration coefficients.

The calibration can be effected off-line or on-line, where in the latter case the calibration can be effected once after manufacturing the N-port receiver.

The calculated calibration coefficients can be stored in a memory.

The calibration signal can assume sequentially in time at least four different complex states.

The first input can be isolated from the second input of the N-port receiver.

The calibration signals can be generated by a passive circuitry.

According to the present invention furthermore a calibration device for the N-port receiver is proposed. The N-port receiver comprises a first input for a RF signal to be detected, a second input for a RF signal originating from a local oscillator and N−2 output terminals. N thereby is an integer larger than two.

The calibration device comprises means for generating calibration signals on the basis of the RF signals supplied by the local oscillator. Furthermore means for feeding the calibration signals to the first input and/or the second input of the N-port receiver is provided. Calibration means calculate calibration coefficients on the basis of the output signals of the N-port receiver in response to the feeding of the calibration signals. The calibration signals are unmodulated signals in contrast to the calibration signals known from the prior art(WO98/02856).

The means for generating the calibration signals on the basis of the RF signal supplied by the local oscillator can be a passive circuitry.

The means for generating calibration signals can comprise a power divider for dividing the RF signal supplied by the local oscillator into a first and a second branch, and means for processing at least one of the first and second branch.

The means for processing at least one of the first and second branch can comprise phase shifting means for generating a plurality of RF signals relatively phase shifted to each other and means for supplying sequentially the RF signal relatively phase shifted to each other to the first input and/or second input of the N-port receiver.

The means for calculating the calibration coefficients can comprise means for sampling time sequentially a plurality of output signals generated by the N-port receiver in response to the feeding of the calibration signal, wherein the calibration signals assume different phase states. Furthermore the means for calculating calibration coefficients can comprise means for calculating the elements of a calibration matrix as calibration coefficients.

The calibration device furthermore can comprise a memory for storing the calculated calibration coefficients.

The first input can be isolated from the second input of the N-port receiver by an active isolation block.

Furthermore, according to another aspect of the present invention a N-port receiver for modulated RF signals comprising a calibration device as said forth above is provided. The calibration device and the N-port receiver can be integrated on one chip.

Further features, advantages and objects of the present invention will become evident for the man skilled in the art by means of the following description of embodiments of the present invention taken in conjunction with the figures of the enclosed drawing.

BRIEF DESCRIPTION OF THE DRAWINGS

FIG. 1b shows a calibration device and a N-port structure according to the present invention designed for a off-line calibration, FIGS. 15 and 16 show a six-port receiver with calibration devices according to the prior art.

DETAILED DESCRIPTION OF THE INVENTION

The solutions according to the present invention allow a simple calibration of N-port receivers, which are commonly used as IQ demodulators or direct demodulators of (n) PSK (n) QAM oscillator modulation schemes. Thereby a local oscillator is used as a RF source. After processing of the input RF signal originating from the local oscillator, calibration signals are provided to at least one of the inputs of the N-port receiver. This presents a simple technological solution to generate the required calibration signals only from the already available LO/RF source via an easy to implant passive circuitry. A more complicated generation of the calibration sequences (modulation, etc.) and an up-conversion block are no longer necessary. This calibration technique may cope with various effects like non-ideal matching of the power sensing devices, non-ideal matching of the associated gain block (providing RF/LF isolation) in very large passive element tolerances.

Figure 1A:
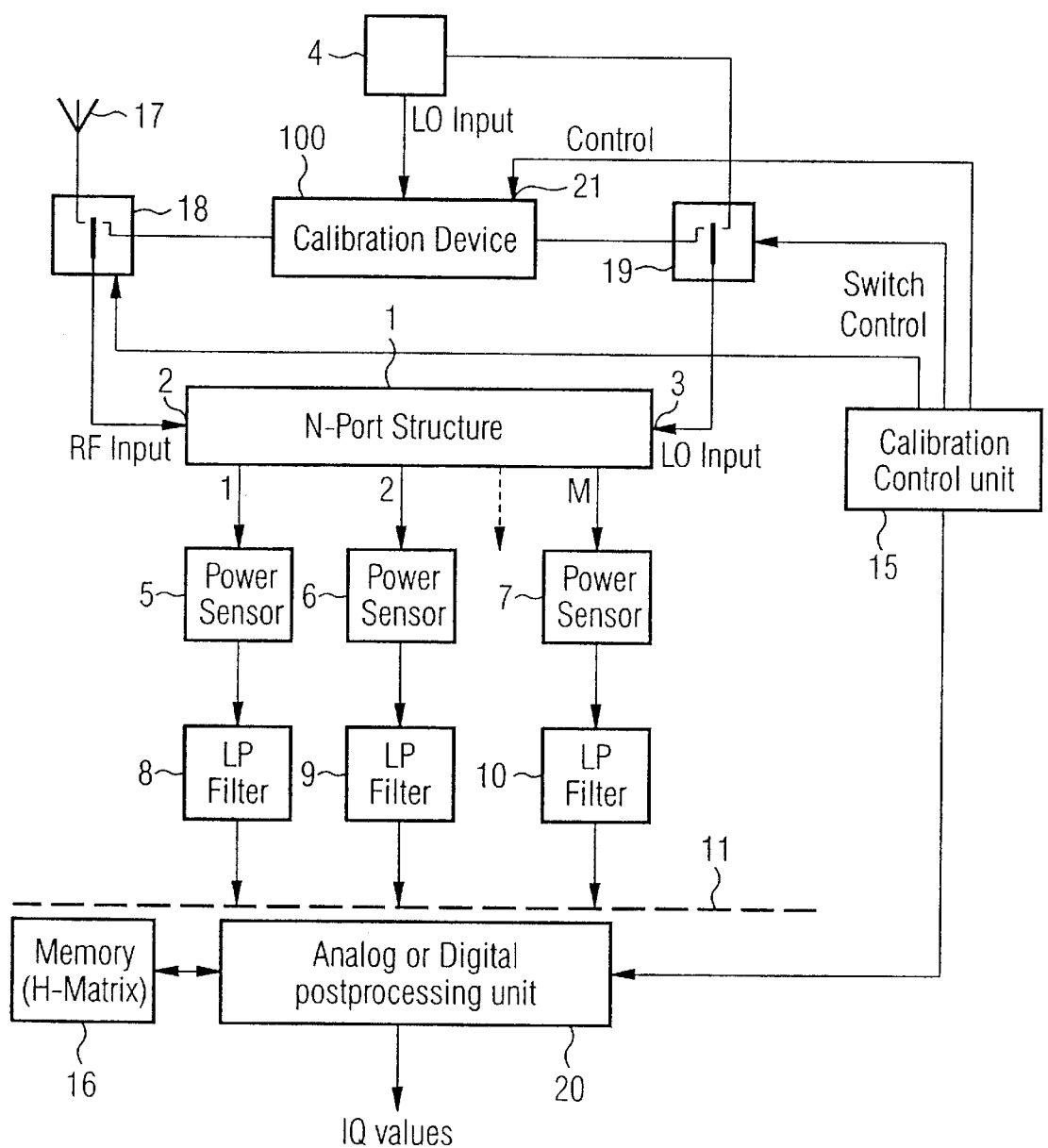
FIG. 1a shows a calibration device and a N-port structure designed for a on-line calibration.

With reference to FIG. 1a an embodiment of the present invention will be explained, wherein said embodiment is designed for an off-line calibration.

As shown in FIG. 1a, the central elements are a calibration device 100 and a N-port structure 1.In the usual operation, a RF signal originating from an antenna 17 is input to a first input 2 of the N-port structure 1. A local oscillator RF signal originating from a local oscillator 4 is input to the second input 3 of the N-port structure 1. As it is known from the prior art, the N-port structure (N being an integer larger than two) has N-2 terminals connected respectively to a power sensor 5, 6, 7 which supplies output signal respectively to a low filter 8, 9, 10.The filtered output signal of the low pass filter 8, 9, 10 is supplied to an interface 11 and than to an analog digital post processing block 17.

In case a calibration process is to be effected, a calibration control unit 15 controls switches 18, 19 as the calibration device 100 such that the first RF input 2 and the second (LO) input 3 of the N-port structure are supplied by output signals of the calibration device 100. The RF signal from the local oscillator 4 is supplied to the calibration device 100. The calibration device 100 processes the RF signal from the local oscillator 4 and supplies calibration signals to the first RF input 2 and the second (LO) input 3 of the N-port structure 1, respectively.

The calibration control unit 15 furthermore controls the calibration device 100 at a control terminal 18.

When a calibration process is effected and the corresponding calibration signals are fed from the calibration device 100 to the first and second input 2, 3 of the N-port structure 1, the analog or digital post processing unit 17 detects the output signals of the low pass filter 8, 9, 10 and calculates calibration coefficients which are stored in a memory 16. The analog or digital post processing unit 17 is also controlled by the calibration control unit 15 to switch from normal operation to calibration and vice versa. In the normal operation the analog or digital post processing unit 17 outputs detected IQ-values calculated on the basis of the output signals of the low pass filter 8, 9, 10.

As can be seen from FIG. 1a, the RF signal from the local oscillator 4 alone is the base for the calibration process and the calibration device 100 processes said RF signal from the local oscillator 4, such that a calibration sequence generator in the baseband regime with subsequent up-conversion to the operation frequency is no longer necessary.

The interfaces necessary to connect the off-chip calibration devices are also shown in FIG. 1a.

FIG. 1b shows a modification of the scheme according to FIG. 1a. According to the embodiment of FIG. 1a the calibration process is controlled by an external calibration hardware 15 controlling a switch 18 and the calibration device 100. Furthermore the external calibration hardware is connected to the memory 16 to store calculated calibration coefficients. To said effect to the external calibration hardware 15 is connected to the DC interface 11, such that the external calibration hardware can calculate the necessary calibration coefficients, which are subsequently stored in the memory 16.

Figure 2:
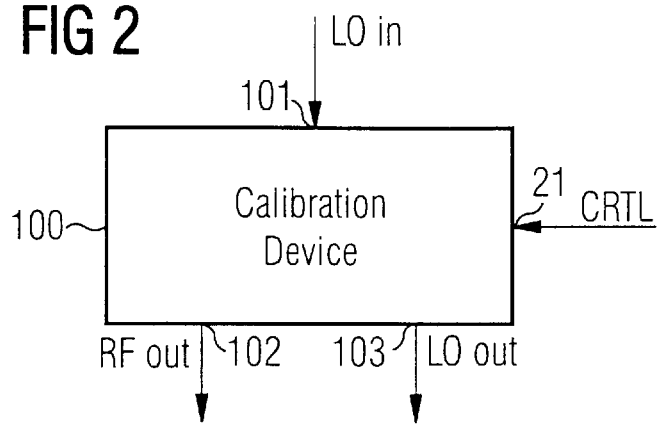
FIG. 2 shows a calibration device according to the present invention.

FIG. 2 shows a calibration device according to the present invention. The calibration device 100 is supplied with a RF signal from a local oscillator at an input terminal 101.

Furthermore a control terminal 21 is provided. The calibration device 100 has two output terminals, of which one is connected to the first RF input 2 of the N-port structure (output terminal 102) and the second output terminal (local oscillator output terminal 103).

Figure 3:
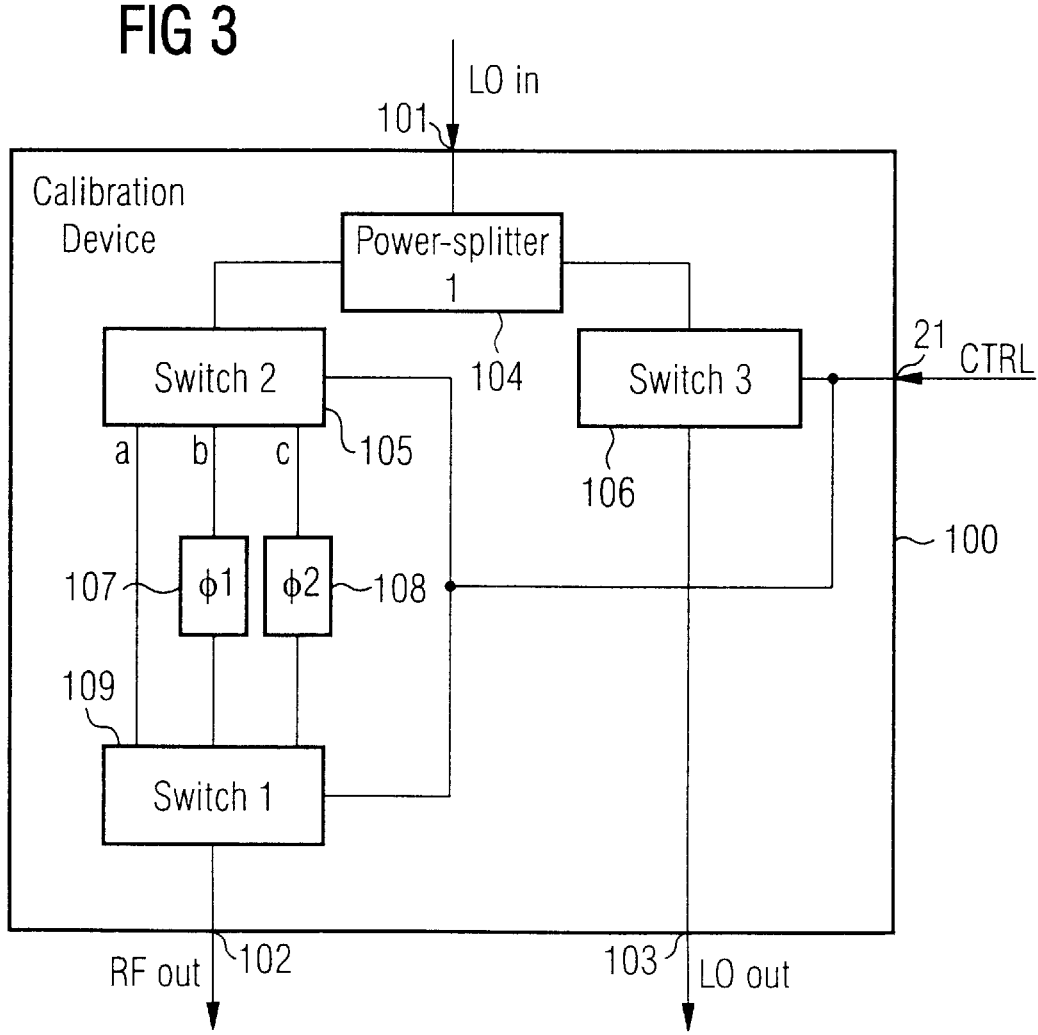
FIG. 3 shows the internal structure of the calibration device shown in FIG. 2 according to a first embodiment.

FIG. 3 shows a first embodiment for the internal structure of the calibration device 100. The RF signal from the local oscillator 4 is supplied to the input 101 of the calibration device 100 and then to a power splitter 104. The power splitter 104 generates a first branch supplied without further processing (apart from switching 106) to the local oscillator output terminal 103. The other branch generated by the power splitter 104 is supplied to a switch 105 controlled a control signal supplied to the control input terminal 21 of the calibration device 100 depending on the control of the switch, this branch calibration signal is either directly supplied to another switch 109 controlled by the control signal from the control terminal 21 (option a), phase shifted by a phase angle $\phi_1$ of a phase shifter 107 (option b) or phaseshifted by a phase angle $\phi_2$ by means of a phase shifter 108. In operation during the calibration process the switches 105 and 109 are controlled such that time sequentially the calibration signal a, the calibration signal b and the calibration signal c, i. e. calibration signals with different phase shifts relatively to each other are supplied to the switch 109 and thus to the RF output terminal 102 of the calibration device 100.

Figure 4:
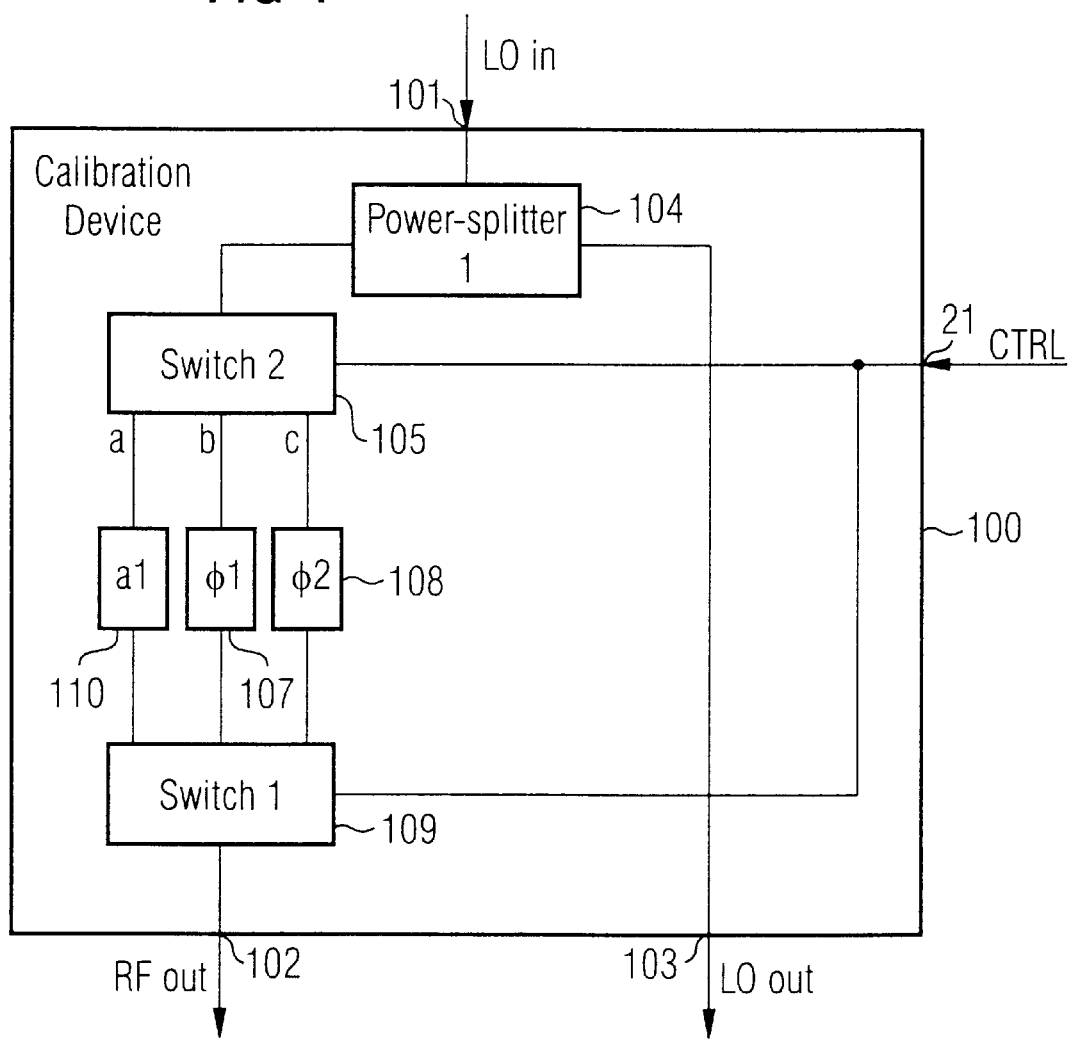
FIG. 4 shows the internal structure of a calibration device according to another embodiment.

FIG. 4 shows a further embodiment of the internal structure of the calibration device 100. In comparison to the embodiment in FIG. 3, an attenuator 110 is connected in the signal part of the calibration signal option a.

Figure 5:
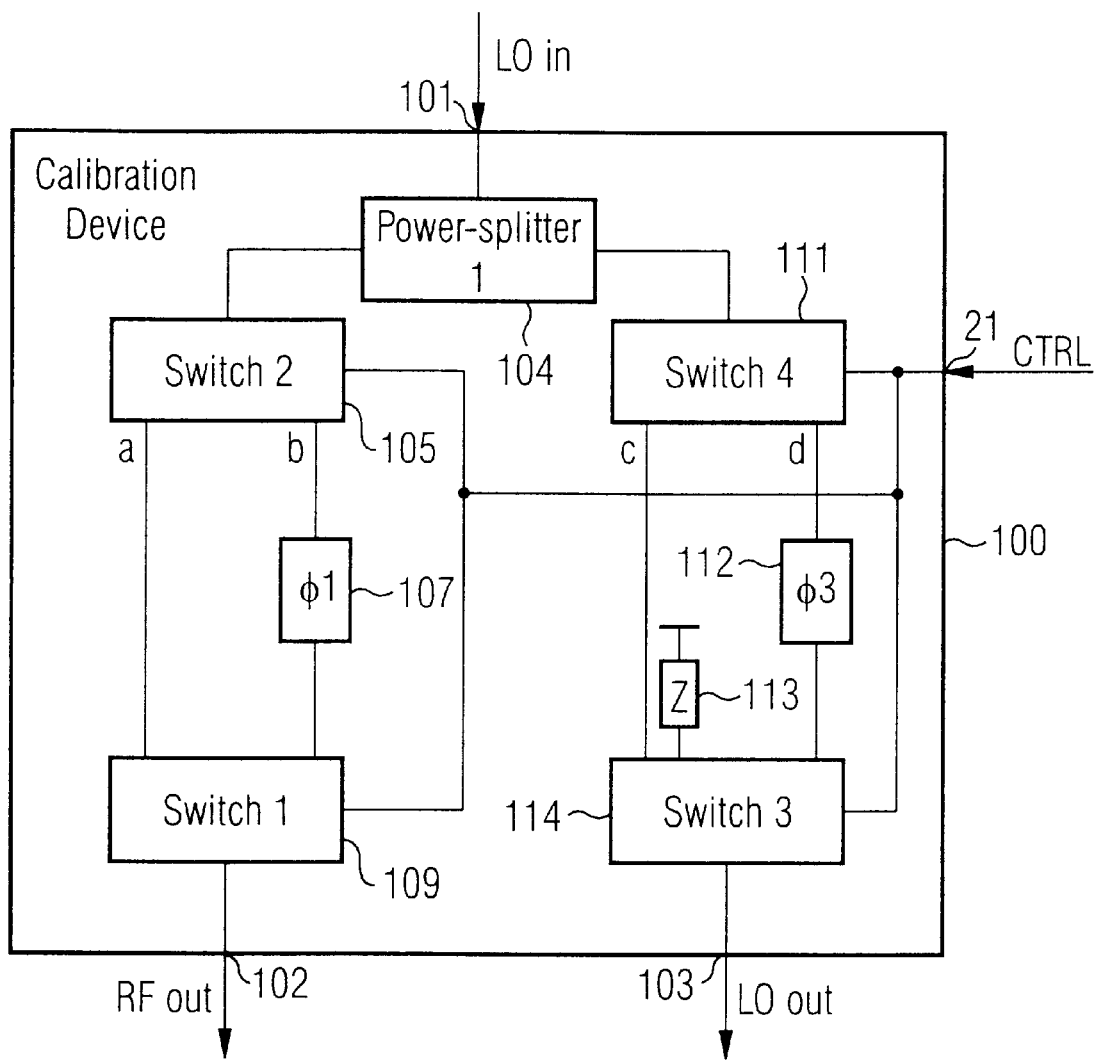
FIG. 5 shows the internal structure of a calibration device according to a still other embodiment.

FIG. 5 shows a further embodiment of the internal structure of the calibration device 100. According to said embodiment also the signal branch supplied to the local oscillator output terminal 103 is processed such that either the signal without phase shift (option c) or a calibration signal with a phase shift $\phi 3$ (option d) is supplied to a switch 114. The switch 114 is connected to a ground by a termination 113. According to said embodiment another common feature to the option of FIG. 2 and FIG. 3, potentially four different calibration signals are supplied to the output terminal 102 and 103, respectively.

Generally the calibration device 100 comprises at least one phase shifter, at least one switch and at least one power splitter.

The calibration device can be integrated together with the N-port structure 1. The N-port device, the power sensors and the calibration device can be manufactured also as a multi-chip solution or a two-device solution.

As has already been explained with reference to FIG. 1a, the calibration procedure using the calibration device according to the present invention can be performed off-line. The obtained calibration coefficients are stored in the memory and used for the operation of the N-port receiver as they are taken into account by the analog or digital post processing unit 20 in normal operation. Temperature caused RF drifts can be compensated off-line by a calibration procedure resulting in up-dated coefficients.

In FIG. 3 a calibration device is presented which consists of one power splitter, three switches and at least two phase shifters. A power splitter provides the LO signals to left and right branches. The signal in the left branch is further provided to switch number 2. With this switch one of the three paths is selected, where one of the paths may have no phase shifter and the remaining two paths have two different phase shifters. These RF and LO output signals are then provided to the first and second input of the N-port receiver, respectively.

In FIG. 4 a calibration device is presented which consists of one power splitter, two switches, at least two phase shifters and at least one attenuator. The power splitter provides the LO signals to the left and right branches. The signal in the left branch is further provided to switch number 2. With this switch one of three paths is selected, where one may have one attenuator and the remaining two paths have two different phase shifters. These RF and LO output signals are then provided to the first and second input of the N-port receiver, respectively.

In FIG. 5 a calibration device is presented, which consists of one power splitter, four switches and at least two phase shifters. The power splitter provides the LO signal to the left and right branches. The signal in the left branch is further provided to switch number 2. This switch is able to select one of two paths, where one of the paths may have one phase shifter. The second path does not need to have any phase shifter. A similar topology is possible for the right branch. The difference is that switch no. 3 may have three states where it may totally suppress the incoming LO signal. These RF and LO output signals are then provided to the first and second input of the N-port receiver, respectively.

All switches, phase shifters, and power splitters may be realized by a plurality of the technology.

Figure 6:
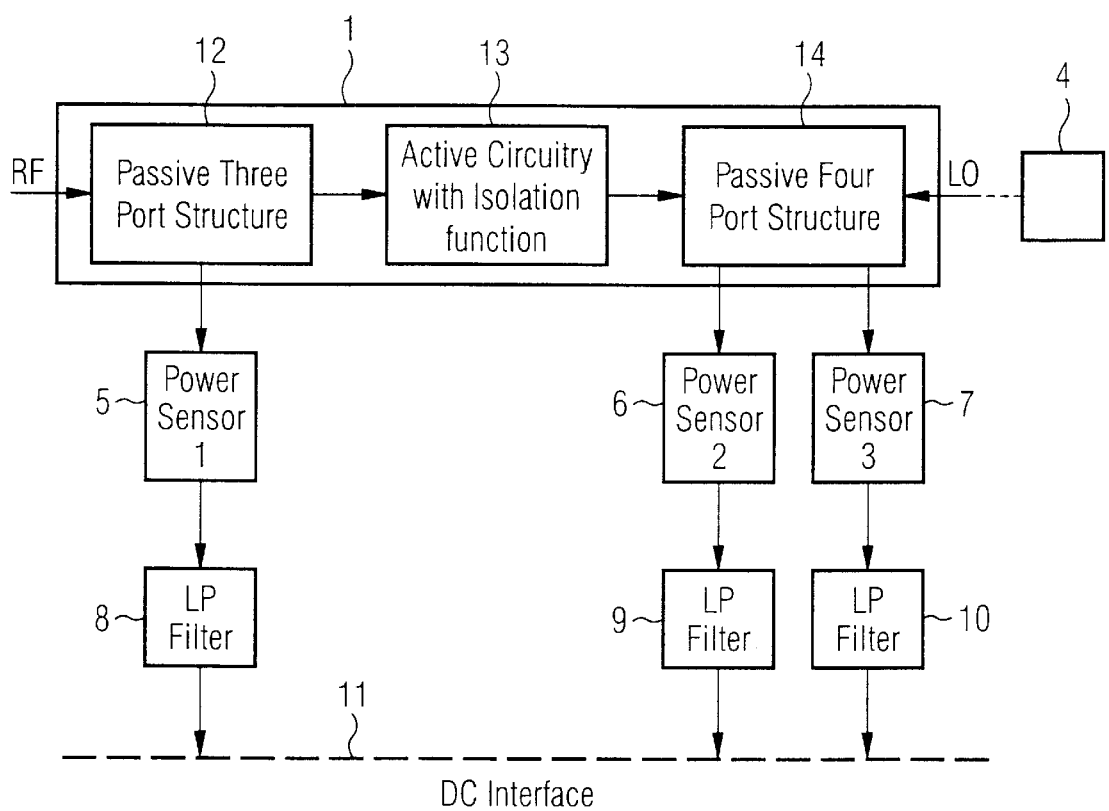
FIG. 6 shows a N-port receiver based on a N-port junction with an active circuitry with isolation function.
Figure 7:
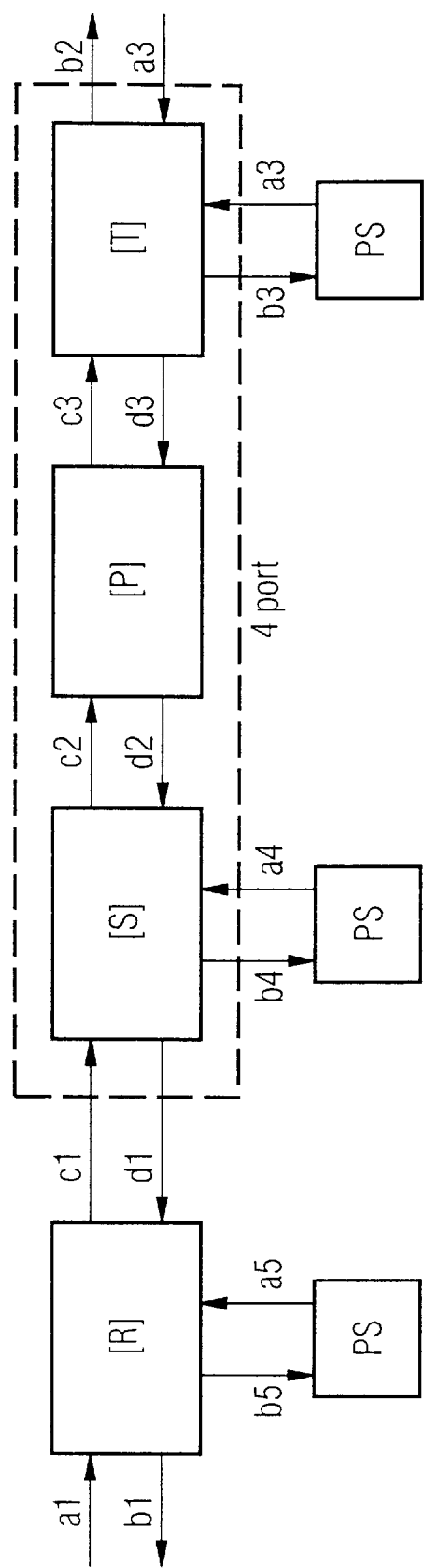
FIG. 7 shows a mathematical representation of a N-port receiver.

FIG. 6 shows preferred embodiment of the internal structure of the N-port structure 1. According to said embodiment the N-port structure is a five-port structure 1 comprising a passive three-port structure 12 connected to a passive four-port structure 14 by means of an active circuitry with RF isolation function (block 13). The passive three-port structure 12 is connected to a power sensor. 5 which supplies an output signal to a low pass filter 8 which is connected to the DC interface 11. The passive four-port structure supplies two output signals power sensors 6, 7, which are respectively connected with the low pass filter 9, 10 supplying output signals to the DC interface 11.

Mathematical Background

Due to manufacturing tolerances, reflections from power sensors or active devices, and a great variety of possible implementations of the N-port structure, a general calibration is desirable, which accounts for the tolerances and imperfections.

Thus, first a general set-up and calibration procedure will be discussed, before applying it to a specific structure. The mathematics here applies to a 5-port device with two inputs and three power sensors. The 5-port device is only an example for N-port devices, N being an integer larger than two.

The measured powers $\overline{P}=(P_1, P_2, P_3)^t$ are solely dependent on the structure of the 5-port, represented by a 3*4 matrix D and the IQ-values, assembled in $\overline{V}=(P_{RF},P_{LO},I,Q)^t$ via $$\overline{P}=D\overline{V}.$$

The IQ values are defined as $I=|s_{RF}|\cos\phi$, $Q=|s_{RF}|\sin\phi$ with a complex RF signal $s_{RF}$ and the phase difference $\phi$ between RF and LO input. By adding the assumed LO power $P_{LO}^0$ as a forth component to the power vector and by introducing a forth row (0 1 0 0) in $\overline{D}$, the above matrix equations gets invertible almost always. Then the IQ values can be reconstructed via $$\overline{V} = \overline{H}\begin{pmatrix} \overline{P} \\ P_{LO}^0 \end{pmatrix} \qquad \text{Eq. 1}$$

All 16 elements of the reconstruction matrix $\overline{H}$ can be calculated from four independent measurements of known input values. This procedure will be called the calibration process. Mathematically it is expressed as $$\overline{H} = \left[ \begin{pmatrix} P_1^1 & P_2^1 & P_3^1 & P_{LO}^1 \\ P_1^2 & P_2^2 & P_3^2 & P_{LO}^2 \\ P_1^3 & P_2^3 & P_3^3 & P_{LO}^3 \\ P_1^4 & P_2^4 & P_3^4 & P_{LO}^4 \end{pmatrix}^{-1} \begin{pmatrix} P_{RF}^1 & P_{LO}^1 & I^1 & Q^1 \\ P_{RF}^2 & P_{LO}^2 & I^2 & Q^2 \\ P_{RF}^3 & P_{LO}^3 & I^3 & Q^3 \\ P_{RF}^4 & P_{LO}^4 & I^4 & Q^4 \end{pmatrix} \right]^t \qquad \text{Eq. 2}$$

where the superscript denotes the number of the measurement.

For a well-suited and robust calibration in the presence of noise, it is extremely important to carefully select the calibration sequence. It has to be one that leads to a low condition number of both, the power matrix (left) and the IQ (right) matrix. The latter determines the calibration sequence and should be designed for simplicity and robustness.

Finally, the IQ values are calculated via $$\begin{pmatrix} I \\ Q \end{pmatrix} = \begin{pmatrix} h_{31} & h_{32} & h_{33} & h_{34} \\ h_{41} & h_{42} & h_{43} & h_{44} \end{pmatrix} \begin{pmatrix} P_1 \\ P_2 \\ P_3 \\ P_{LO} \end{pmatrix} \quad \text{Eq. 3}$$

Thus, for reconstruction of the IQ values, only eight real multiplications are required.

Figure 8:
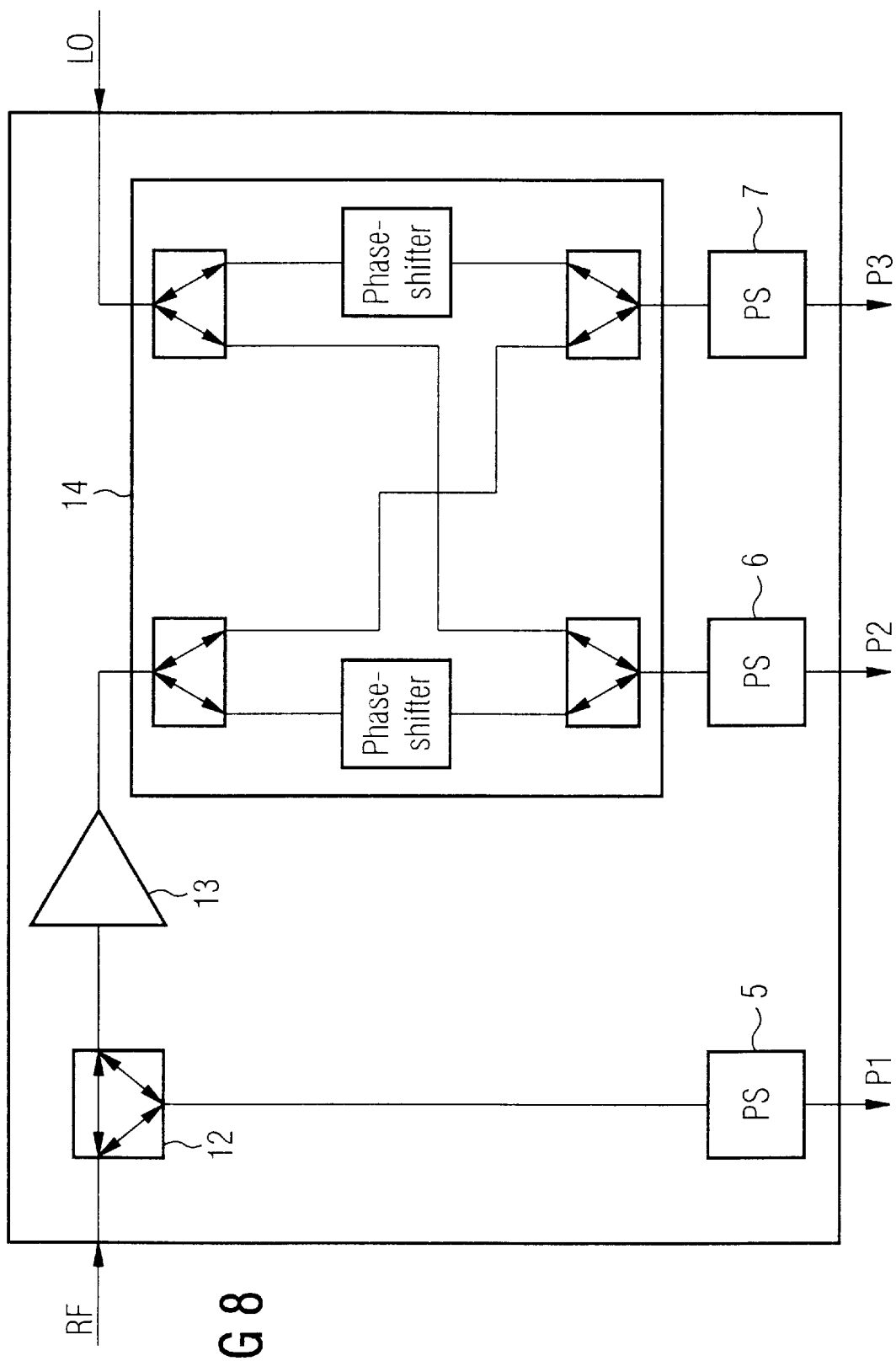
FIG. 8 shows a functional description of a N-port receiver.

A method of operation is described using a 5-port receiver with RF/IF isolation functionality (shown in FIG. 6). It consists of a 3-port (RF input), an active or non-reciprocal circuitry providing an isolation function and possibly some amplification of the RF input signal. A phase shifter interconnects the additional two 3-ports. The phase shift should be unequal to $m\pi/2$ (m is an integer value), an advantageous value would be $\pi/4$. An alternative topology for 5-port structure may be seen in FIG. 8. At all three output ports the powers of the signals are measured and low pass filtered. The complex vector ratio between LO and RF signal can be reconstructed within a DSP or especially designed analogue circuitry.

Calibration Sequences and Their Generation

According to the described mathematical model, different sequences may be used, but the key features for their choice are:

they have to lead to well conditioned matrices in order to obtain a robust calibration they have to be simple, in order to be realized by the simple RF treatment of the LO signal, with a minimum number of switches, phase shifters and attenuators.

The choices of simple and sufficiently stable calibration sequences are shown in Tab. 1.

TABLE 1

| | Calibration signals | | | |
| --- | --- | --- | --- | --- |
| | 1 (equal power) | | 2 (equal LO signal) | |
| No. | $S_{LO}$ | $S_{RF}$ | $S_{LO}$ | $S_{RF}$ |
| 1 | 1 | 1 | 1 | ½ |
| 2 | 1 | j | 1 | j |
| 3 | 0 | 1 | 1 | 1 |
| 4 | 1 | $-(1 + j)/\sqrt{2}$ | 1 | $-j$ |

Other signal sequences are also possible. However, the above are well suited and very simple to generate.

The signals can be created by a simple passive or active circuit entity, examples of the realization are shown in FIG. 3, 4, 5.

Generally, during the calibration process four different known complex signals are sent to the RF and LO input. For each signal pair, the power levels are measured and stored. After all signals have been applied and powers have been measured, the device matrix H is calculated according to Eq. 2.

For the above example the proposed calibration has a complexity of:

4 different pairs of signals need to be applied, 4 real IQ vectors (4 values) for the calibration signals need to be stored, 4 real power vectors (4 values) need to be stored, one real 4 by 4 matrix needs to be inverted, two 4 dimensional vectors need to be multiplied with one 4 by 4 matrices.

The calibration of the N-port device can be done at different stages of life-cycle and operation:

1. After manufacturing the N-port is calibrated via a highly accurate calibration device as described above, the extracted H-matrix is stored in the memory and further used for the calculation. Advantages:

The N-port receiver device is accurately calibrated,

It needs to be calibrated only once, so that the calibration device itself does not need to be part of the total receiver circuitry, Calibration is done off-line, thus, the final system does not require any calibration control logic, Calculations of the H-matrix elements are done off-line. So the internal DSP only has to store 8 elements and the IQ values are calculated involving e. g. two dot-products with 4 dimensional vectors.

Disadvantages:

Aging, temperature drift cannot be accounted for.

2. The calibration is done on-line, e. g. during initialization or at some time during operation of the device.

Advantages:

Errors due to aging and drift effects are accounted for

A one-chip solution is possible

Nothing needs to be done after manufacturing, every calibration is done later and automatically.

Disadvantages:

Due to tolerances even in the calibration device, the error correction is less accurate, Some calibration logic is needed within the final device.

All computations have to be done on board. Thus the requirements for digital processing are large.

However, repeating the calibration can significantly reduce the influence of variations, fluctuations, and noise during the calibration process. The computed power and IQ matrices are then averaged, so that a significantly more accurate error correction achieved.

After calibration, the H-matrix is calculated and the required eight elements are stored. During every measurement cycle three powers are detected. In a DSP or some analog circuitry the power values including the initially known power of the local oscillator are multiplied by the 2 by 4 elements of the correction matrix. Finally the IQ values are available at the output of the DSP.

The final calibration matrix may be recalculated by the following methods of operation:

1. One sequence, consisting of four complex states, is sent to the N-port receiver input and all related 8 real calibration coefficients are calculated and stored into the memory for use in error correction.

2. One sequence that consists of four complex states is sent to the N-port receiver inputs several times. The related eight real calibration coefficients are calculated after each sequence. After all repetitions are done, the averages of all the calibration coefficients are calculated and stored in the memory for further use in error correction.

3. Different sequences, consisting of four complex states, are sent to the N-port receiver input and the related 8 real calibration coefficients are calculated. After all sequences are sent, the coefficients are averaged and are stored in the memory for later use in error correction.

4. Combinations of items 2 and 3 (above) can be used.

5. A long calibration sequence, consisting of at least four complex states, is sent to the receiver input and the IQ-values and measured power values are stored in the memory. The related 8 calibration sequences are calculated e. g. by means of generalized inversion of the power matrix, a least square algorithm, any possible method to solve general rectangular systems of equation.

The coefficients are stored and used for later error correction.

In Table 2, calibration coefficients (four for I values and four for Q value) are calculated, using three different sets of sequences. It may be observed that the deviations of the coefficient are very small in all the cases, so that averaging may be performed in order to obtain the final values.

TABLE 2

Calibration coefficients, originating from three different sets of calibration signals (1, 2) as in Tab. 1, (3) with a badly conditioned IQ-matrix, (4) ideal (undisturbed) calibration signals.

| | Cal. sequence | $h_{i1}$ | $h_{i2}$ | $h_{i3}$ | $h_{i4}$ |
|---|---|---|---|---|---|
| | (1) equal LO | 4.7673 | −2.5437 | −1.7942 | 0.5385 |
| | (2) equal phase | 4.8164 | −2.5517 | −1.8340 | 0.5348 |
| I | (3) condition (69) | 4.7780 | −2.5334 | −1.8112 | 0.5347 |
| | (4) ideal cal. | 4.7703 | −2.5342 | −1.7889 | 0.5381 |
| | (1) equal LO | −2.9099 | 2.2468 | −1.7830 | 0.3760 |
| Q | (2) equal phase | −2.8260 | 2.2287 | −1.8498 | 0.3640 |
| | (3) condition (69) | −2.9619 | 2.2467 | −1.5823 | 0.3788 |
| | (4) ideal cal. | −2.8622 | 2.2361 | −1.7889 | 0.3703 |

Accuracy Enhanced Error Correction for N-port Devices With Isolation Function For further improvement of the calibration and operation of the receiver it may be desirable to isolate power sensor 1 (FIGS. 1, 6) from the LO port. This can be done by a great variety of realizations e. g. non-reciprocal or active elements, elaborated passive (resistive)) circuit design.

In such a design, the first power ($P_1$) is directly proportional to the power of the RF signal. additionally, there are only few passive circuit elements in the signal path and it can be assumed that errors and tolerances are less critical.

With such a design, it is possible to get a very accurate estimate for the power of the incoming RF signal, which can be exploited to enhance the accuracy of the IQ signals. During calibration one additional factor $H_P$ is calculated via the simple operation $$H_P = \frac{1}{N} \frac{\sum_{i=1}^{N} P_{RF}^i}{\sum_{i=1}^{N} P_1^i} \qquad \text{Equ. 4}$$

During operation, one additional value $P'_{RF}=P_1/H_P$ is calculated from the detected value $P_1$. It can be assumed, that the new factor $P'_{RF}$ is more accurate than $P_{RF}$ calculated from Eq. 1 and thus should be used to enhance the accuracy of the IQ-values via $$I' = I \frac{P'_{RF}}{\sqrt{I^2 + Q^2}}, \quad Q' = Q \frac{P'_{RF}}{\sqrt{I^2 + Q^2}} \qquad \text{Equ. 5}$$

TABLE 3

Legend of used Variables

| | |
|---|---|
| $S_{RF}$ | RF signal to be I/Q demodulated |
| $S_{LO}$ | Second RF signal (known, usually local oscillator) |
| $\phi$ | Phase angle between RF and LO signal |
| $\overline{V}, \overline{P}$ | (Vector) collection of IQ values and measured powers |
| $v$ | Gain of the amplifier stage (complex) |
| $i_{11}, i_{22}$ | Complex input and output reflection coefficients of the amplifier |
| I, Q, I', Q' | In- and quadratur phase components of $S_{RF}$ |
| $P_1, P_2, P_3$ | Detected powers at respective sensors |
| $P_{RF}, P_{LO}$ | RF and LO powers |
| $X^i$ | i-th calibration signal X |
| $\overline{\overline{D}}$ | Transfer matrix of the device |
| $\overline{\overline{H}}, h_{ij}$ | Device matrix for calculation of IQ values, elements of the matrix |

Verification of the Proposed Solution by Simulations

Figure 9:
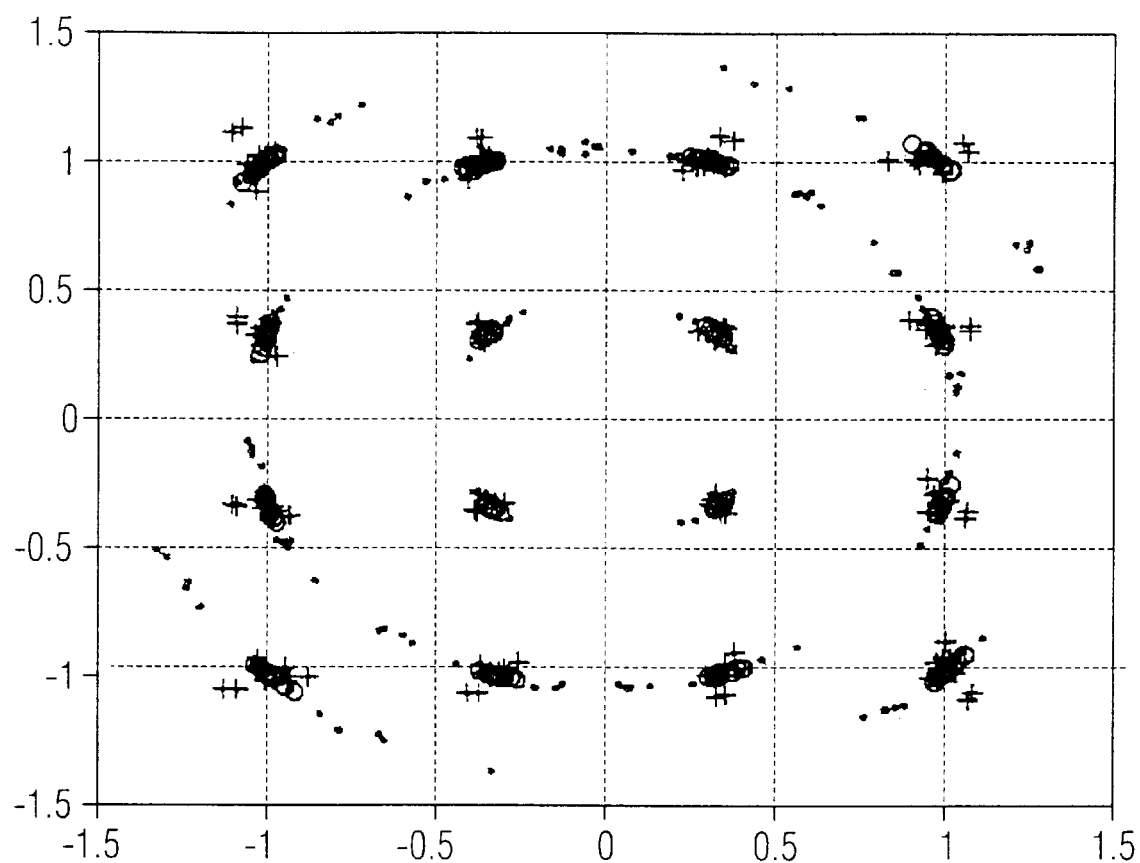
FIGS. 9 to 14 show simulation results.
Figure 10:
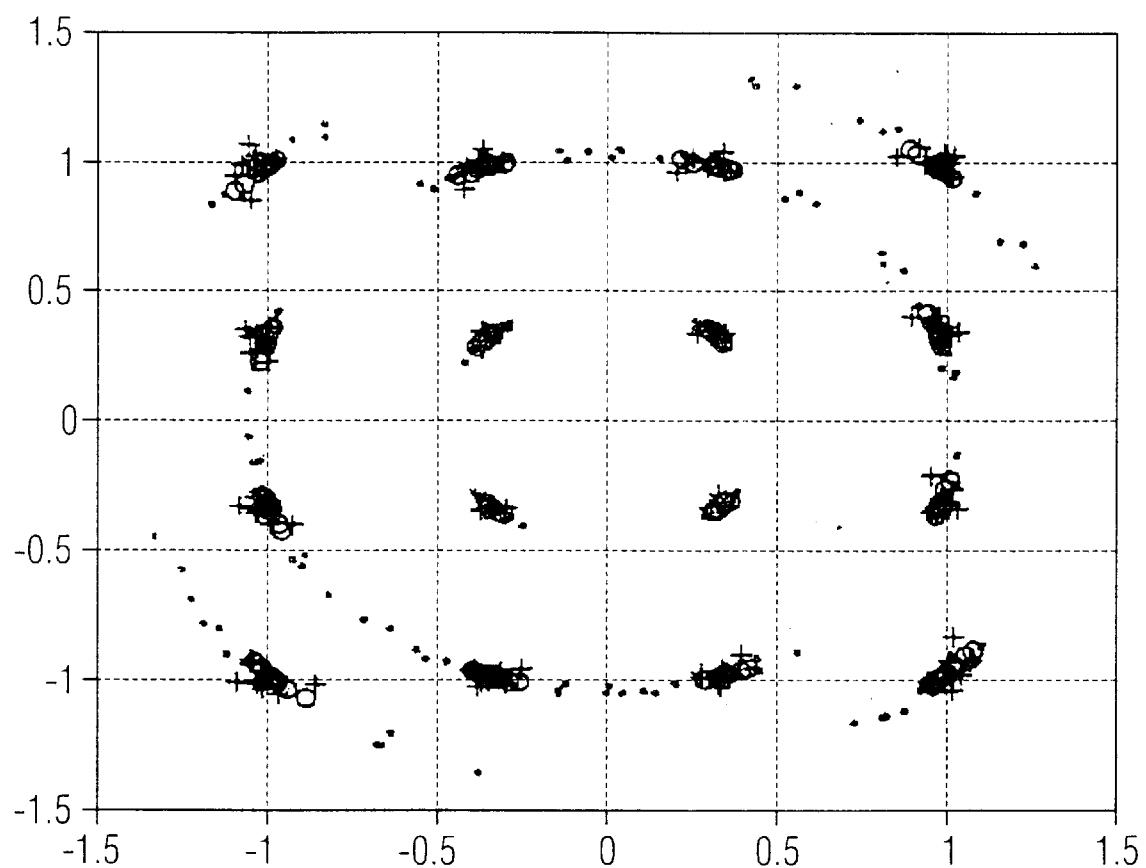
Figure 11:
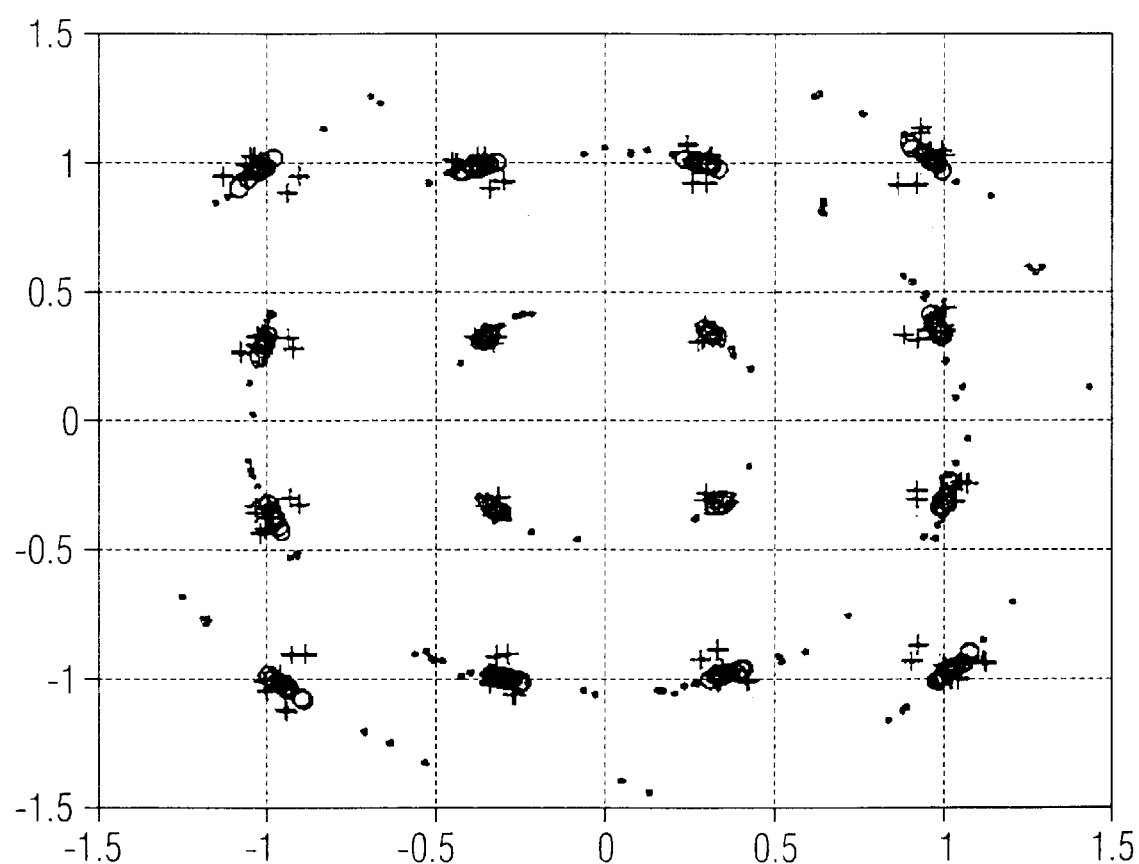
Figure 12:
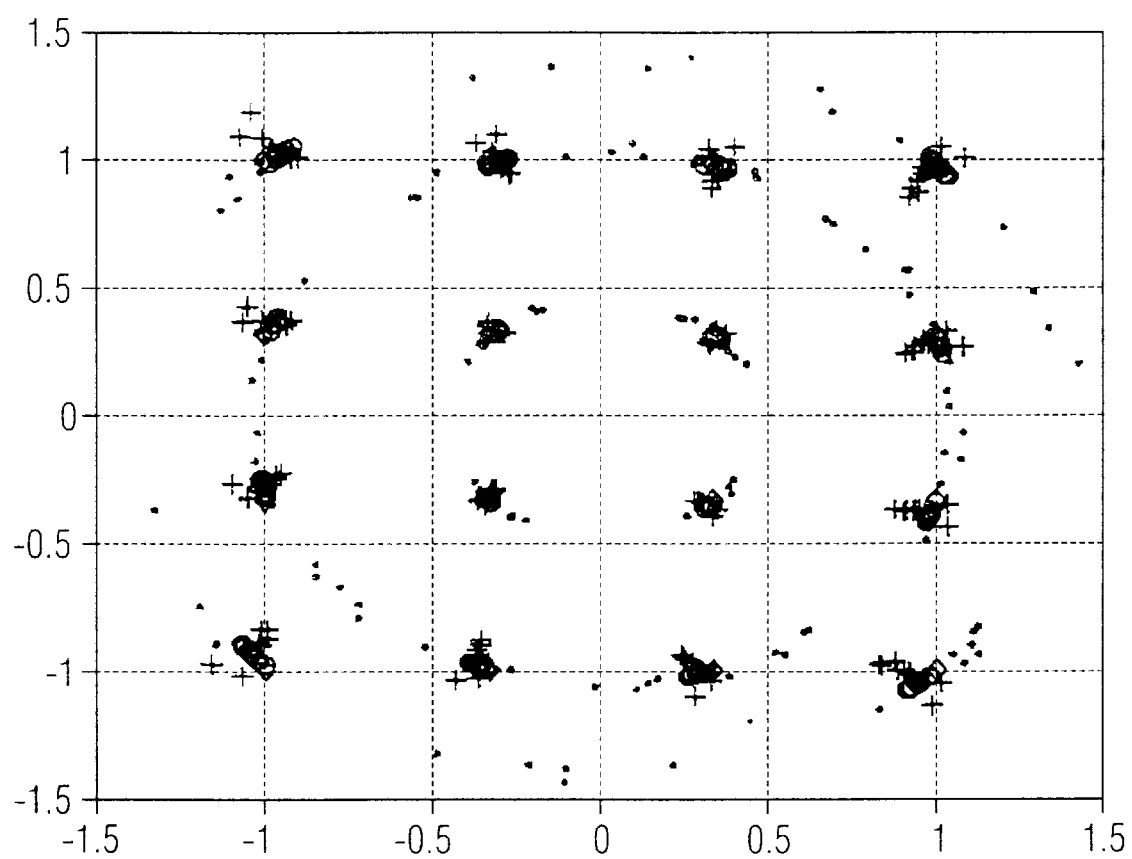

As a numerical example the 5-port structure (related to FIG. 6) was under investigation. All 3-port structures are considered equal. Each of them is treated as star connected resistors, where each of them is having Z/3 resistance (Z is the characteristic impedance, usually 50 Ω). Each resistor has a parasitic reactive part of Z/60. The active circuitry with isolation function is realized by a simple non-matched amplifier having 10 dB gain, and equal input and output reflection loss $i_{11}=i_{22}=-6$dB. Results are presented for 16 QAM signals, with and without associated noise. A manufacturing tolerance of 20% is assumed. During operation the variation of all circuit elements is 1%. The local oscillator has a 10% variation even during calibration. During this phase, all tolerances are applied and all the calibration signals are assumed to have a tolerance of 1% or 20%, respectively. In FIGS. 9 and 10 calibration sequence (1) of Tab. 1 is used and three different cases are compared, the RF-QAM signal is noiseless. Without calibration (●), the device will not allow a correct detection of the symbols, whereas in the calibrated case (+), the noise is significantly reduced and the device will allow a low bit error rate. The variation in this case originate solely from element variations during operation (1%) and LO noise (10%). The constellation can be further improved by enhancing the accuracy via an N-port structure with isolation function(O) as described above. The same is true for the second calibration sequence. The simulation results are shown in FIG. 11, 12.

Figure 13:
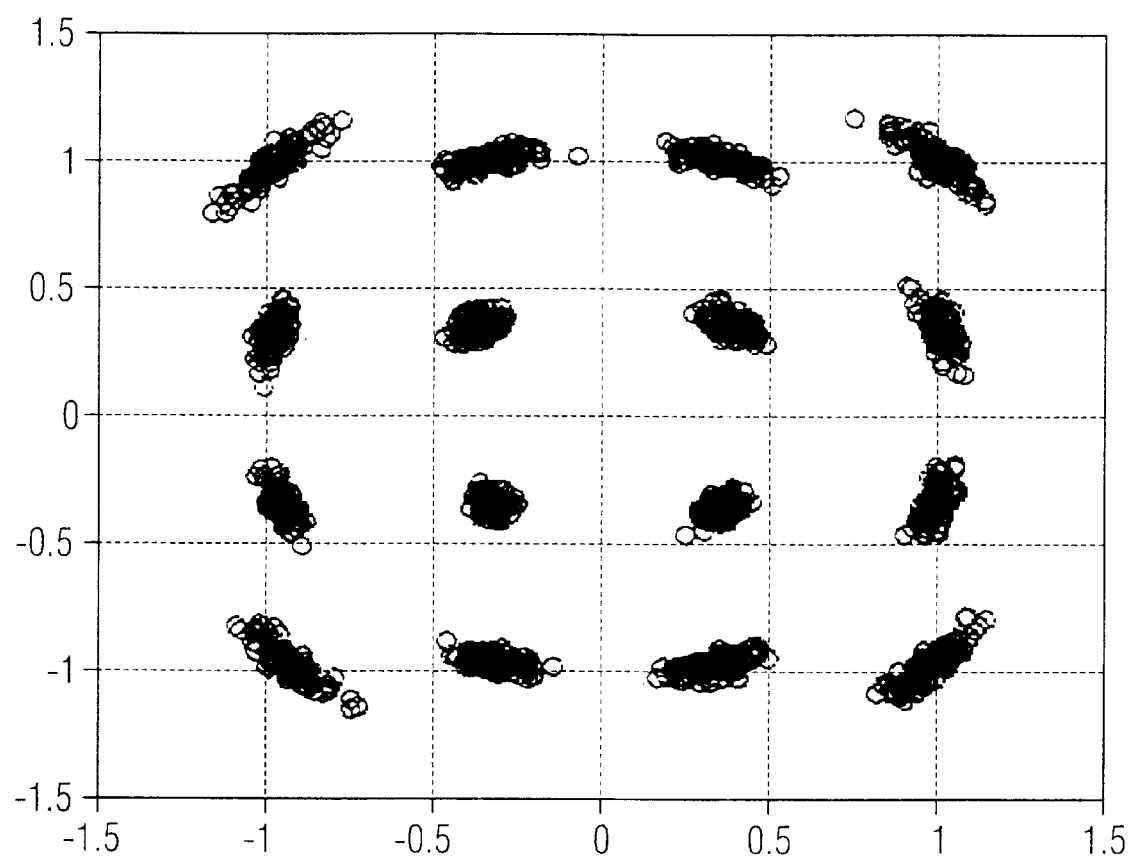
Figure 14:
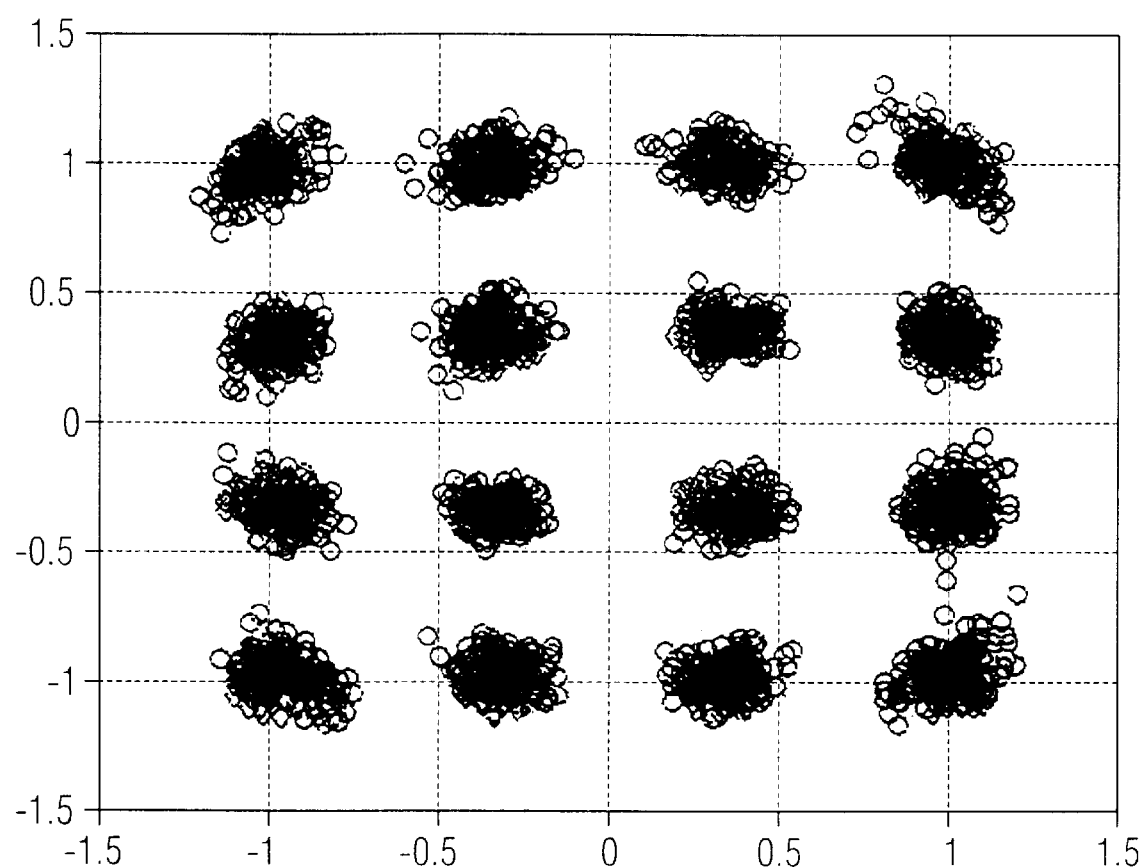
Figure 17A:
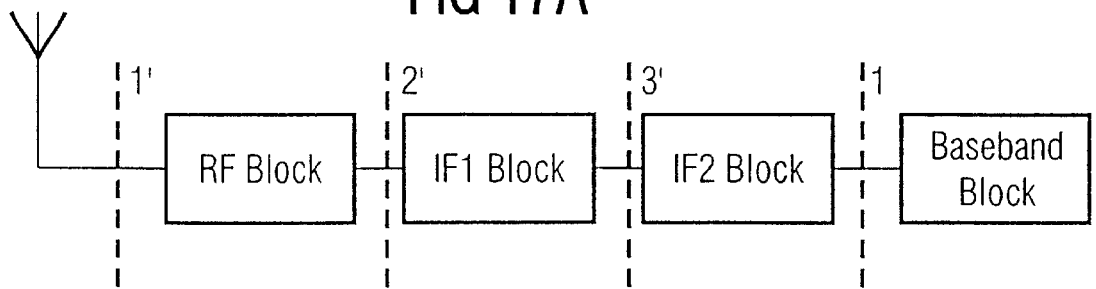
FIGS. 17A, 17B and 18 shows the general concept of N-port junction based receivers.
Figure 17B:
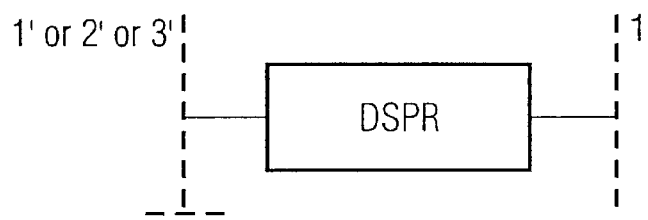
Figure 18:
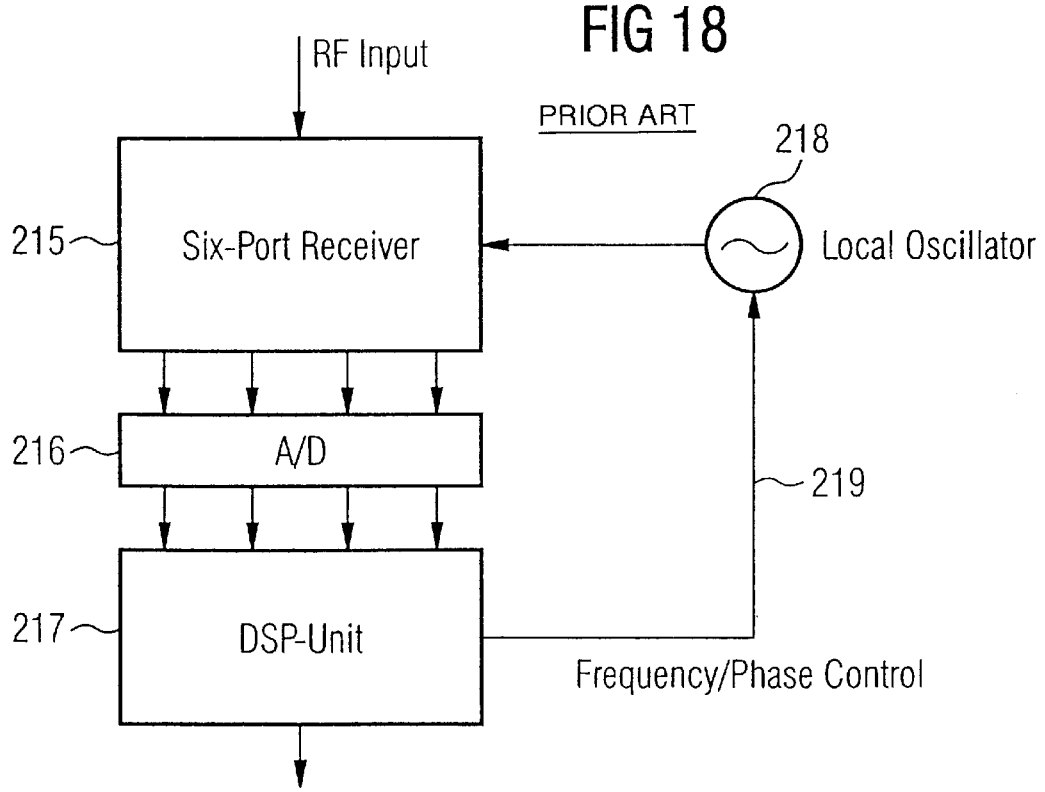

In order to prove the functionality of the system in the case of larger drift and element value variation during operation, in FIG. 13 a simulation result is shown for element tolerances of 10% for the best possible calibration scheme. This case may occur, when calibrating the N-port off-line, e. g. directly after manufacturing. At last, the effect of noise in a worst case scenario is examined. Again, high tolerance of the element values of 10% and a signal to noise ratio of 20 dB of the RF signal are assumed. FIG. 14 proves that the calibration scheme does still work even under these conditions.

A new calibration device and method of calibration for N-port receiver structure of digitally modulated signals, is proposed.

Proposed device and related method of operation offers a simple implementation solution, with minimum additional RF circuitry, where available LO signal is reused.

The main advantage of the proposed technology is that calibration sequences are generated only by the usage of the LO signal and additional passive RF circuitry of the calibration device. Output signals of the calibration device are connected to the N-port receiver in order to perform the proposed calibration. Therefore there is no need to have an additional RF source, which has to be modulated.

What is claimed is:

1. Method for calibrating a N-port receiver, wherein the N-port receiver (1) has two inputs and N−2 outputs; the two inputs consisting of a first input (2) for a RF signal to be detected and a second input (2) for a RF signal originating from a local oscillator (4); N being an integer larger than 2, the method comprising the following steps:

generating calibration signals using the local oscillator signal (4), feeding the calibration signals to one of the first input (2) and the second input (3) of the N-port receiver (1), and calculating calibration coefficients on the basis of the output signals of the N-port receiver (1) in response to the feeding of the calibration signals, wherein the calibration signals are unmodulated signals.

2. Method according to claim 1, characterized in that the step of generating calibration signals comprises the following steps:

dividing the local oscillator signal into a first and a second branch, and processing at least one of the first and second branch.

3. Method according to claim 2, characterized in that the step of processing at least one of the first and second branch comprises the following step:

generating a plurality of RF signals relatively phase shifted to each other, and supplying sequentially the RF signals relatively phase shifted to each other to the first input (2) and/or the second input (3) of the N-port receiver (1).

4. Method according to claim 1, characterized in that the step of calculating calibration coefficients comprises the steps of:

sampling time sequentially a plurality of output signals generated by the N-port receiver (1) in response to the feeding of the calibration signal, wherein the calibration signal assumes different phase states, and calculating the elements of a calibration matrix as calibration coefficients.

5. Method according to claim 1, characterized in that the calibration is performed off-line.

6. Method according to claim 5, characterized in that the calibration is performed once after manufacturing of the N-port receiver (1).

7. Method according to claim 1, characterized in that the calibration is performed on-line.

8. Method according to claim 1, characterized in that it comprises furthermore the step of storing (16) the calculated calibration coefficients.

9. Method according to claim 1, characterized in that the calibration signal sequentially in time assumes at least four different complex states.

10. Method according to claim 1, characterized in that the first input (2) is isolated from the second input (3) of the N-port receiver (1).

11. Method according to claim 1, characterized in that the calibration signals are generated by passing the local oscillator signal through a passive circuitry (100).

12. Method according to claim 1, characterized in that the calibration coefficients are calculated by averaging over a plurality of calibration cycles.

13. Calibration device for a N-port receiver, wherein the N-port receiver (1) has two inputs and N−2 outputs; the two inputs consisting of a first input (2) for a RF signal to be detected and a second input (2) for a RF signal originating from a local oscillator (4); N being an integer larger than 2, the calibration device comprising:

means (100) for generating calibration signals on the basis of the RF signal supplied by the local oscillator (4), means for feeding the calibration signals to one of the first input (2) and the second input (3) of the N-port receiver (1), and means for calculating calibration coefficients on the basis of the output signals generated by the N-port receiver (1) in response to the feeding of the calibration signals, wherein the calibration signals are unmodulated signals.

14. Device according to claim 13, characterized in that the means (100) for generating the calibration signals on the basis of the RF signal supplied by the local oscillator (4) is a passive circuitry.

15. Device according to claim 13, characterized in that means for generating calibration signals comprises:

a power divider for dividing the RF signal supplied by the local oscillator (4) into a first and a second branch, and means for processing at least one of the first and second branch.

16. Device according to claim 15, characterized in that the means for processing at least one of the first and second branch comprise:

phase shifting means for generating a plurality of RF signals relatively phase shifted to each other, and means for supplying sequentially the RF signals relatively phase shifted to each other to the first input (2) and/or second input (3) of the N-port receiver (1).

17. Device according to claim 13, characterized in that the means for calculating calibration coefficients comprise:

means for sampling time sequentially a plurality of output signals generated by the N-port receiver (1) in response to the feeding of the calibration signal, wherein the calibration signal assumes different phase states, and means for calculating the elements of a calibration matrix as calibration coefficients.

18. Device according to claim 13, characterized in that it comprises furthermore a memory (16) for storing the calculated calibration coefficients.

19. Device according to claim 13, characterized in that the calibration signal sequentially in time assumes at least four different complex states.

20. Device according to claim 13, characterized in that the first input (2) is isolated from the second input (3) of the N-port receiver (1) by means of a isolation block (13) with an active circuitry.

21. N-port receiver for modulated RF signals, characterized in that it comprises a calibration device according to claim 13.

22. N-port receiver according to claim 21, the calibration device (100) and the N-port receiver (1) are integrated on one chip.

* * * * *